United States Patent
Namkoong et al.

(10) Patent No.: US 7,999,595 B2
(45) Date of Patent: Aug. 16, 2011

(54) RECTIFYING AND LEVEL SHIFTING CIRCUIT

(75) Inventors: Jinyung Namkoong, San Jose, CA (US); Arvind Bomdica, Fremont, CA (US); Ming-Ju Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/560,991

(22) Filed: Sep. 16, 2009

(65) Prior Publication Data

US 2011/0063010 A1    Mar. 17, 2011

(51) Int. Cl.
    *G03L 5/00*    (2006.01)
(52) U.S. Cl. .......................................... 327/306; 326/80
(58) Field of Classification Search .......... 327/560–563, 327/306, 333; 326/62–63, 80–82
See application file for complete search history.

(56) References Cited

U.S. PATENT DOCUMENTS

| | | | | |
|---|---|---|---|---|
| 6,046,875 | A * | 4/2000 | Siniscalchi et al. | 360/67 |
| 6,529,075 | B2 * | 3/2003 | Bruck et al. | 330/252 |
| 6,583,652 | B1 * | 6/2003 | Klein et al. | 327/103 |

* cited by examiner

*Primary Examiner* — Dinh T. Le
(74) *Attorney, Agent, or Firm* — Vedder Price P.C.

(57) ABSTRACT

A circuit includes a differential circuit having at least to two inputs, a first variable impedance circuit, and a second variable impedance circuit. The first variable impedance circuit is between a first branch of the differential circuit and an output. The first variable impedance circuit provides a first variable impedance. The a second variable impedance circuit is between a second branch of the differential circuit and the output. The second variable impedance circuit provides a second variable impedance. The first variable impedance and the second variable impedance vary in accordance with a voltage difference between the two inputs.

20 Claims, 6 Drawing Sheets

RECTIFYING AND LEVEL SHIFTING CIRCUIT

FIELD

The present disclosure generally relates to rectifying and level shifting circuits, and more particularly, to rectifying and level shifting circuits for use in detecting the presence of information communicated via a differential communication path.

BACKGROUND

Increasing processing speeds of devices such as graphics processors, hard disks, network cards, and other high speed I/O devices have created a need for an increased bandwidth for communicating between devices. One way to increase bandwidth between the bridge circuit and the I/O device is to use a differential communication link such as PCI Express™, HyperTransport™, SATA, USB, and other suitable differential communication links. Such interfaces are a flexible, hybrid serial-parallel interface format that uses multiple differential communication links often referred to as lanes. Each link includes transmit lanes to transmit information and receive lanes to receive information.

During certain modes of operation such as during a non-transmission mode, a low power mode, and/or other suitable modes of operation, the transmit lanes are clamped (e.g., coupled) to the same voltage (e.g., common mode voltage). As such, it is necessary for a receiver associated with the receive lanes to detect this mode of operation by sensing a differential voltage swing of the differential communication link. For example, the receiver can detect that the transmit lines are clamped when the voltage swing is less than a low threshold and that the transmit lines are not clamped when the differential voltage swing is greater than a high threshold. However, the low and high thresholds are typically at small signal levels, which can make it difficult for the receiver to detect due to, among other things, physical variations in the receiver (e.g., caused during the manufacturing process).

Figure 1:
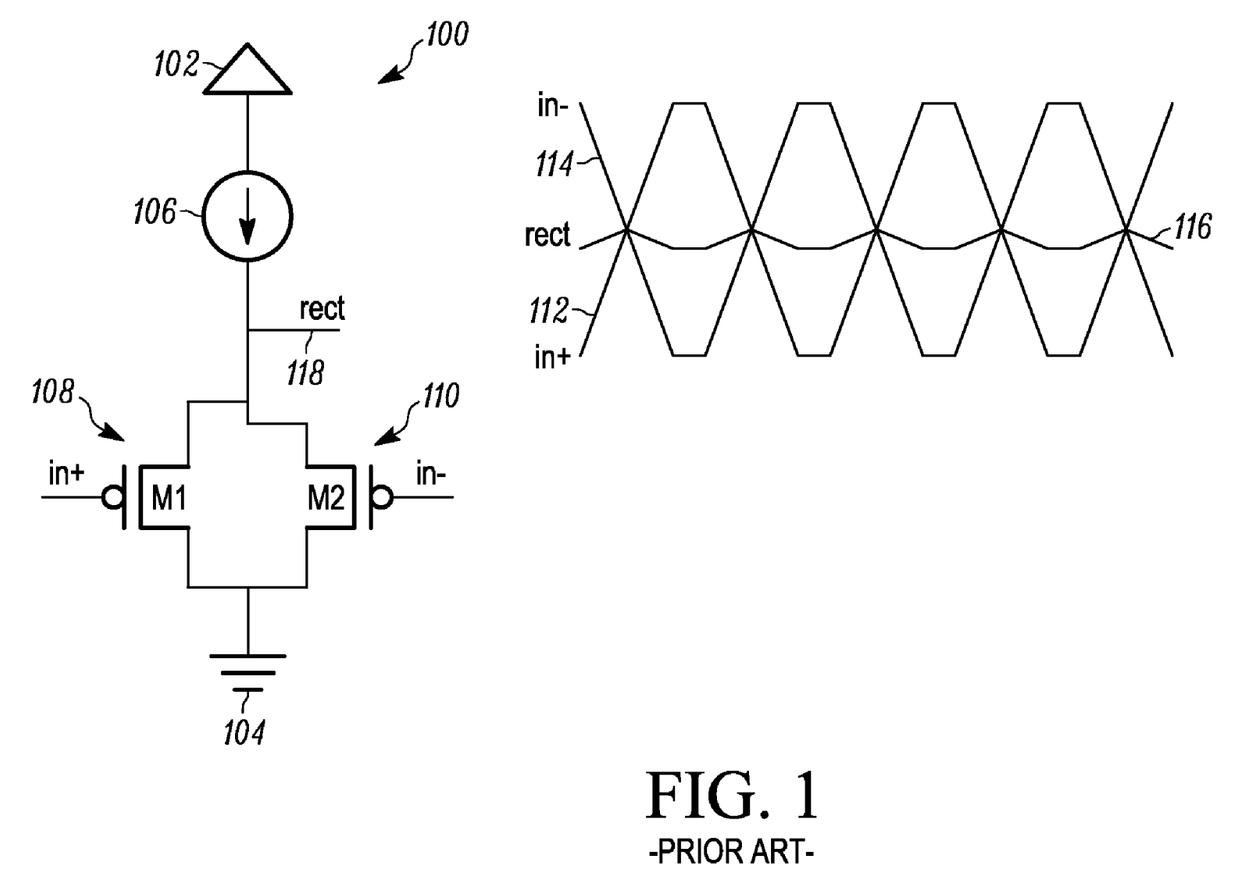
FIG. 1 is an exemplary depiction of a rectifier circuit according to the prior art.

Known receivers typically use an idle (or squelch) detection circuit to detect the voltage swing. For example, one known idle (or squelch) detection circuit typically includes a rectifier circuit 100, as shown in FIG. 1, to rectify the voltage swing thereby aiding in detection of the voltage swing. As shown, the rectifier circuit 100 is coupled to a first power source 102 and a second power source 104 (e.g., ground). The rectifier circuit 100 includes a current source circuit 106, a first transistor 108, and a second transistor 110 configured as shown. The first transistor 108 is responsive to a first voltage 112 (e.g., in+) of the voltage swing. The second transistor 110 is responsive to a second voltage 114 (e.g., in−) of the voltage swing. In response to the first voltage 112 and the second voltage 114, the rectifier circuit 100 provides a rectified voltage 116 via output terminal 118. When the rectified voltage 116 has a deviation from the common mode voltage that is less than the low threshold, the receiver detects that the transmit lines are clamped. In addition, when the rectified voltage 116 has a deviation from the common mode voltage that is greater than the high threshold, the receiver detects that the transmit lines are not clamped. Although, the rectifier circuit 100 works, it is rather inefficient at detecting small voltage swings that are used in many high speed communication links, which is undesirable.

Accordingly, a need exists for a circuit that is capable of efficiently detecting whether the transmit lanes are clamped to the same voltage while overcoming the aforementioned disadvantages of conventional circuits.

BRIEF DESCRIPTION OF THE DRAWINGS

The invention will be more readily understood in view of the following description when accompanied by the below figures, wherein like reference numerals represent like elements.

DETAILED DESCRIPTION

In one example, a circuit includes a differential circuit having at least to two inputs, a first variable impedance circuit, and a second variable impedance circuit. The first variable impedance circuit is between a first branch of the differential circuit and an output. The first variable impedance circuit provides a first variable impedance. The a second variable impedance circuit is between a second branch of the differential circuit and the output. The second variable impedance circuit provides a second variable impedance. The first variable impedance and the second variable impedance vary in accordance with a voltage difference between the two inputs.

The circuit provides, among other advantages, efficient rectifying and level shifting due to the variable impedances varying in a manner to pull peaks of the differential voltage up to a higher voltage level than conventional circuits. As such, voltage swings are larger than conventional circuits making them easier to detect. In addition, the larger voltage swings can effectively reduce detection errors caused by physical variations in the circuit (e.g., due to manufacturing processes). Other advantages will be recognized by those of ordinary skill in the art.

In one example, the first variable impedance is at a first impedance value in response to current flowing in a first direction and a second impedance value in response to current flowing in a second direction opposite the first direction. The second variable impedance is at a third impedance value in response to current flowing in a third direction and a fourth impedance value in response to current flowing in a fourth direction opposite the third direction.

In one example, the first variable impedance decreases in response to a first voltage of one of the two inputs being greater than a second voltage of another of the two inputs. In one example, the second variable impedance remains substantially unchanged in response to the first voltage being greater than the second voltage.

In one example, the first variable impedance circuit includes a first transistor having a first, second, and third terminal. The first terminal is coupled to the first branch. The second terminal is coupled to a power source input or one of the two inputs. The third terminal is coupled to the output. The second variable impedance circuit includes a second transistor having a fourth, fifth, and sixth terminal. The fourth terminal is coupled to the second branch. The fifth terminal is coupled to the power source input or another of the at least two inputs. The sixth terminal is coupled to the output.

In one example, the circuit includes a first impedance circuit and a second impedance. The first impedance circuit is between the first branch and a second output. The second impedance circuit is between the second branch and the second output. The output provides a rectified output voltage and the second output provides a common mode voltage.

In one example, the circuit includes a comparator circuit that compares the rectified output voltage and the common mode voltage. In one example, the circuit includes a power management circuit enables another circuit in response to a comparison of the rectified output voltage and the common mode voltage.

In one example, an idle detection circuit includes the circuit. In one example, a receiver circuit includes the circuit. One of the two inputs is responsive to a first path of a differential communication path and another other of the two inputs is responsive to a second path of the differential communication path.

In one example, a device includes a transmitter circuit and a receiver circuit. The transmitter circuit and receiver circuit are coupled to a differential communication path. The receiver circuit includes the circuit configured such that the two inputs responsive to a respective path the differential communication path.

In one example, a computer readable medium includes information that when executed by at least one processor causes the processor to operate, design, and/or organize the circuit. In one example, the information includes hardware description language.

As used herein, the term "circuit" can include an electronic circuit, one or more processors (e.g., shared, dedicated, or group of processors such as but not limited to microprocessors, DSPs, or central processing units) and memory that execute one or more software or firmware programs, combinational logic circuits, an ASIC, and/or other suitable components that provide the described functionality. Unless otherwise stated, the term "power down" refers to removing (or lowering) the source power of a "circuit" and/or "device" rendering it inoperative and/or the "circuit" and/or "device" transitioning into a mode of operation that consumes less power than when in a normal mode of operation. In addition, the term "power up" refers to adding (or increasing) the source power of a "circuit" and/or "device" rendering it operative and/or the "circuit" and/or "device" transitioning into a normal mode of operation from a mode of operation that consumes less power than the normal mode of operation. Additionally, as will be appreciated by those of ordinary skill in the art, the operation, design, and organization, of a "circuit" can be described in a hardware description language such as Verilog™, VHDL, or other suitable hardware description languages.

Figure 2:
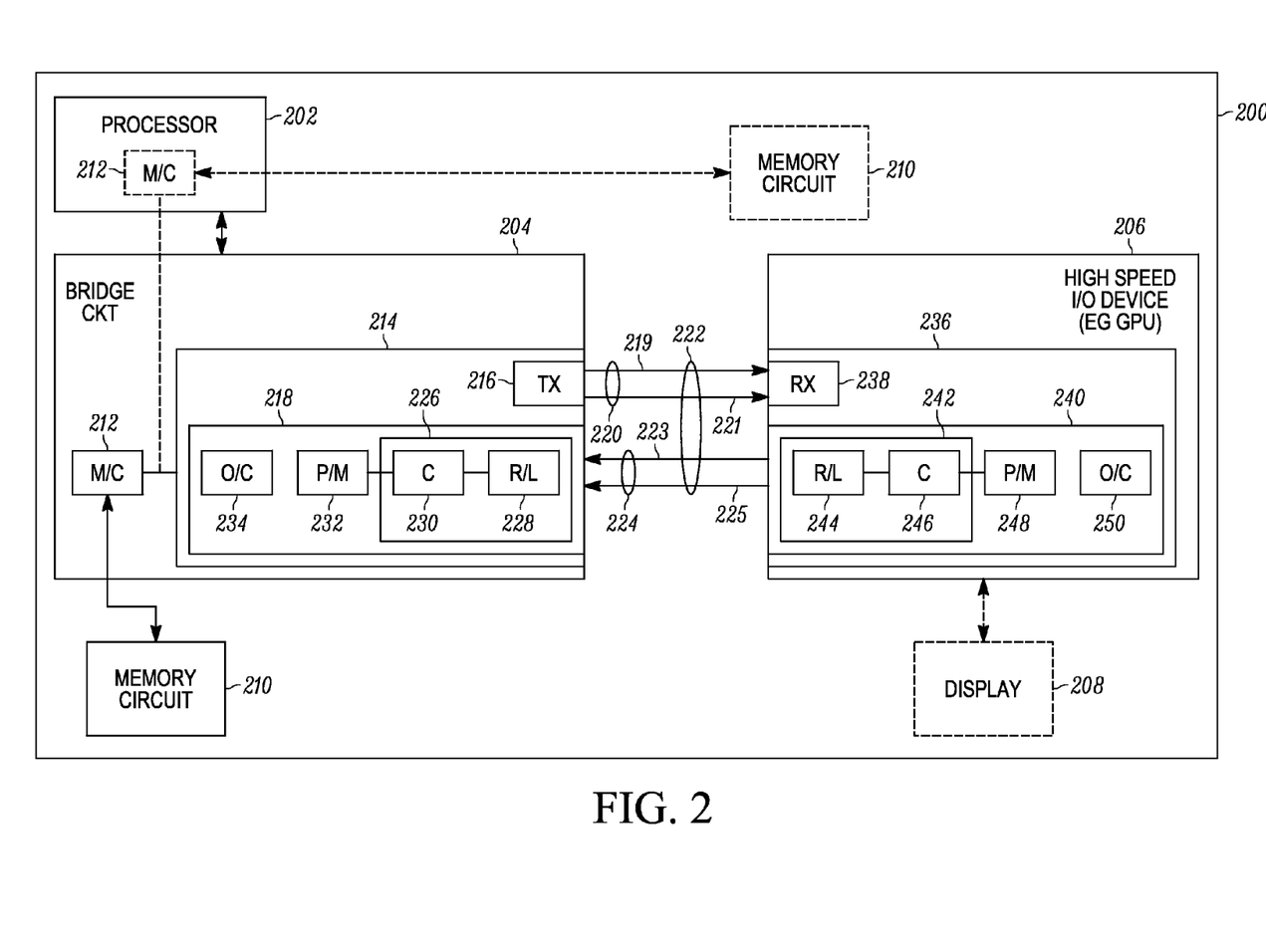
FIG. 2 is an exemplary functional block diagram of block diagram of a device that includes a rectifying and level shifting circuit according to the present disclosure.

Referring now to FIG. 2, an exemplary functional block diagram of a device 200 such as a wireless phone, a mobile and/or stationary computer, a printer, a LAN interface (wireless and/or wired), a media player, a video decoder and/or encoder, and/or any other suitable digital device is depicted. The device 200 includes at least one processor circuit 202, a bridge circuit 204, a high speed I/O circuit 206 such as a graphics processor circuit (or core) and associated display 208, and a memory circuit 210.

The processor circuit 202 is operatively coupled to the bridge circuit 204 and processes requests from the bridge circuit 204. In some embodiments, the bridge circuit 204 includes a memory controller circuit 212 that is operatively coupled to the memory circuit 210. The memory circuit 210 stores information communicated from the bridge circuit 204. In other embodiments, the processor circuit 202 includes the memory controller circuit 212 that is operatively coupled to the memory circuit 212, which stores information communicated from the processor circuit 202.

The bridge circuit 204 includes a first transceiver circuit 214. The first transceiver circuit 214 includes a first transmitter circuit 216 and a first receiver circuit 218. The first transmitter circuit 216 transmits information via a first differential communication path 220 of a differential communication link 222. The receiver circuit 218 receives information via a second differential communication path 224, having a first path 223 and a second path 225, of the differential communication link 222. The differential communication link 222 can be any suitable differential communication link such as, but not limited to, PCI Express™, HyperTransport™, SATA, USB, and other suitable differential communication links.

The first receiver circuit 218 includes a first detection circuit 226 (e.g., an idle or squelch detection circuit) that can include a first rectifying and level-shifting circuit 228 and a first comparator circuit 230. The first receiver circuit 218 can also include a first power management circuit 232 and/or other suitable receiver circuit(s) 234 that may be used to process received information. In some embodiments, the first detection circuit 226 is coupled in parallel to the other receiver circuit(s) 234.

The first rectifying and level-shifting circuit 228 rectifies and level shifts a differential voltage received via the second differential communication path 224. The first comparator circuit 230 compares the rectified and level shifted voltage from the first rectifying and level-shifting circuit 228 to a threshold value. In response to the comparison, the first power management circuit 232 selectively enables or disables the other receiver circuit(s) 234. For example, in one embodiment, if the rectified and level shifted voltage is less than (or equal to) the threshold value, the power management circuit 232 can disable (or power down) the other receiver circuits 234 because no information is being received via the second differential communication path 224. In addition, if for example, the rectified and level shifted voltage is greater than (or equal to) the threshold value, the power management circuit 232 can enable (or power up) the other receiver circuits 234 in order to receive information via the second differential communication path 224.

Although the first receiver circuit 218 is included in a bridge circuit in this example, skilled artisans will appreciate that the first receiver circuit 218 can be included in any other suitable receiver circuit and/or device that requires idle detection of a differential communication path. Furthermore, skilled artisans will appreciate that the receiver circuit 218 can receive from any suitable circuit and/or device such as, for example, the high speed I/O device 206.

The high speed I/O device 206 includes a second transceiver circuit 236. The second transceiver circuit 236 includes a second transmitter circuit 240 and a second receiver circuit 238. The second transmitter circuit 240 transmits information via the second differential communication path 224 of the differential communication link 222. The second receiver circuit 238 receives information via the first differential communication path 220 of the differential communication link 222.

The second receiver circuit 238 includes a second detection circuit 242 (e.g., an idle or squelch detection circuit) that includes a second rectifying and level-shifting circuit 244 and a second comparator circuit 246. The second receiver circuit 238 can also include a second power management circuit 248 and/or other suitable receiver circuit(s) 250 that may used to process received information. In some embodiments, the second detection circuit 242 is coupled in parallel to the other receiver circuit(s) 250.

The second rectifying and level-shifting circuit 244 rectifies and level shifts a differential voltage received via the first differential communication path 220 having a first path 219 and a second path 221. The second comparator circuit 246 compares the rectified and level shifted voltage from the second rectifying and level-shifting circuit 244 to a second threshold value, which can be the same as the first threshold value if desired. In response to the comparison, the second power management circuit 248 selectively enables or disables the other receiver circuits 250. For example, in one embodiment, if the rectified and level shifted voltage is less than (or equal to) the second threshold value, the second power management circuit 248 can disable (or power down) the other receiver circuits 250 because no information is being received via the first differential communication path 222. In addition, if for example, the rectified and level shifted voltage is greater than (or equal to) the threshold value, the power management circuit 248 can enable (or power up) the other receiver circuits 250 in order to receive information via the first differential communication path 222.

Figure 3:
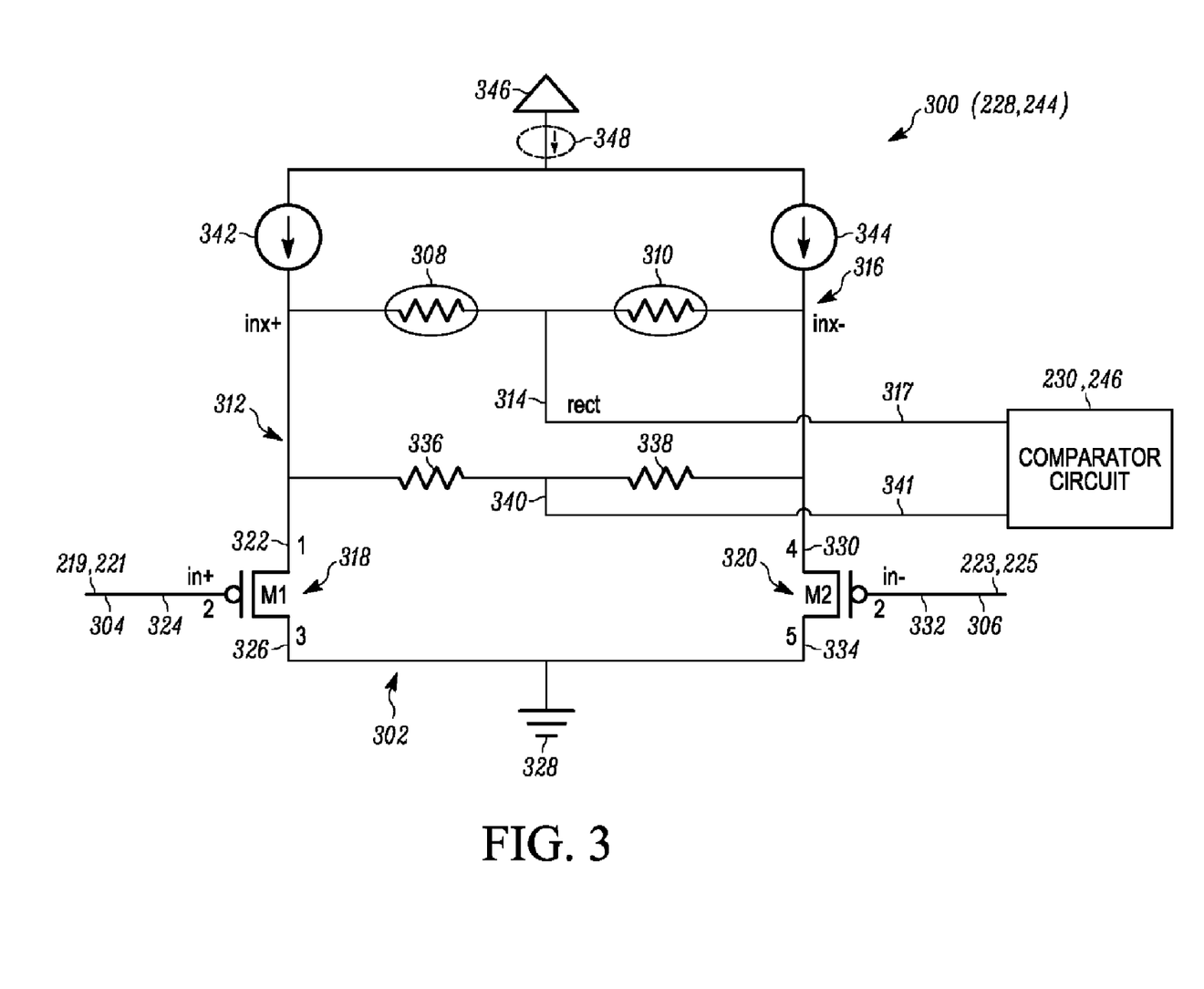
FIG. 3 is an exemplary diagram the rectifying and level shifting circuit.

Referring now to FIG. 3, an exemplary diagram of the rectifying and level shifting circuit 228, 244 hereinafter referred to as rectifying and level-shifting circuit 300. The rectifying and level shifting circuit 300 includes a differential circuit 302 having a first input 304 and a second input 306. In this example, the first input 304 is coupled to the first path 219, 221 of the first differential path 220 and the second input 306 is coupled to the second path 223, 225 of the second differential path 224. The rectifying and level shifting circuit 300 also includes a first variable impedance circuit 308 and a second variable impedance circuit 310. The first variable impedance circuit 308 is coupled between a first branch 312 of the differential circuit 302 and a first output 314. The second variable impedance circuit 310 is coupled between a second branch 316 of the differential circuit 302 and the first output 314. The first output 314 provides a rectified and level shifted voltage 317 based on a differential voltage (e.g., in+ and in−) applied to the first input 304 and the second input 306. In this example, the differential voltage represents information received via differential communication path 220, 224.

The first variable impedance circuit 308 provides a first variable impedance that varies in accordance with the differential voltage between the first input 304 and the second input 306. Likewise, the second variable impedance 310 provides a second variable impedance that varies in accordance with the differential voltage between the first input 304 and the second input 306.

The first variable impedance circuit 308 and the second variable impedance 310 are non-linear in nature. For example, the first variable impedance value is at a first impedance value (e.g., 1 kOhm) in response to current flowing in one direction and a second impedance value (e.g., 10 kOhm) in response to current flowing in an opposite direction. Likewise, the second variable impedance is at a third impedance value (e.g., 1 kOhm) in response to current flowing in one direction and a fourth impedance value (e.g., 10 kOhm) in response to current flowing in an opposite direction. Although exemplary impedance values are provided in this example, other values can be used if desired. In addition, in some embodiments, one or more of the first, second, third, and fourth impedance values can be the same value if desired.

In one embodiment, the first variable impedance value can decrease in response to a voltage applied to the first input 304 being greater than another voltage applied to the second input 306 or vice versa. Likewise, the second variable impedance value can decrease in response to a voltage applied to the second input 306 being greater than another voltage applied to the first input 304 or vice versa.

In another embodiment, the first variable impedance value can decrease in response to a voltage applied to the second input 306 being greater than another voltage applied to the first input 304. Likewise, the second variable impedance value can decrease in response to a voltage applied to the first input 304 being greater than another voltage applied to the second input 306.

The rectifying and level-shifting circuit 300 also includes a first transistor 318 and a second transistor 320. The first and second transistors 318, 320 can be any suitable transistor known in the art such as a Metal Oxide Semiconductor Field Effect Transistor (MOSFET) for example. Although depicted as a p-channel MOSFETs, the first and second transistors 318, 320 can also be n-channel MOSFETs if desired.

The first transistor 318 includes a first terminal 322, a second terminal 324, and a third terminal 326. In this example, the first terminal 322 is a source terminal, the second terminal 324 is a gate terminal, and the third terminal 326 is a drain terminal. The first terminal 322 is coupled to the first branch 312. The second terminal 324 is coupled to the first input 304. The third terminal 326 is coupled to a first voltage source 328. The first voltage source 328 can provide any suitable voltage such as ground for example.

The second transistor 320 includes a fourth terminal 330, a fifth terminal 332, and a sixth terminal 334. In this example, the fourth terminal 330 is a source terminal, the fifth terminal 332 is a gate terminal, and the sixth terminal 334 is a drain terminal. The fourth terminal 330 is coupled to the second branch 316. The fifth terminal 332 is coupled to the second input 306. The sixth terminal 334 is coupled to the first voltage source 328.

The rectifying and level-shifting circuit 300 can also include a first impedance circuit 336 and a second impedance circuit 338. The first impedance circuit 336 is coupled between the first branch 312 and a second output 340. The second impedance 338 is coupled between the second branch 316 and the second output 340. The second output 340 is provides a level shifted common mode voltage 341 of the rectifying and level-shifting circuit 300. The first and second impedance circuits 336, 338 can provide any suitable impedance values such as 10 kOhm. In addition, in one embodiment, the first and second impedance circuits 336, 338 can provide impedance values that are substantially the same.

The rectifying and level-shifting circuit 300 can also include a first current source circuit 342 and a second current source circuit 344. The first current source circuit 342 is coupled between the first branch 312 and a second voltage source 346. The second voltage source 346 can provide any suitable voltage such as +1.0 v, +1.8 v, +3.3 v, +5 v or other suitable voltage. The second current source circuit 344 is coupled between the second branch 316 and the second voltage source 346. Although two current sources 342, 344 are depicted in this example, skilled artisans can appreciate that the current sources 342, 344 can be replaced by any suitable current source configuration if desired.

As noted above, during operation, the first variable impedance circuit 308 provides the first variable impedance, which varies in accordance with the differential voltage between the first input 304 and the second input 306. Likewise, the second variable impedance 310 provides a second variable impedance that varies in accordance with the differential voltage between the first input 304 and the second input 306. In addition, the first variable impedance value can decrease in response to a voltage applied to the first input 304 being greater than another voltage applied to the second input 306 or vice versa. Likewise, the second variable impedance value can decrease in response to a voltage applied to the second input 306 being greater than another voltage applied to the first input 304 or vice versa.

The first output 314 provides the rectified and level shifted voltage 317 in response to the differential voltage (e.g., in+ and in−) applied to the first input 304 and the second input 306. In addition, the second output 340 provides the level shifted common mode voltage 341 of the rectifying and level-shifting circuit 300. The comparator circuit 230, 246 compares the rectified and level shifted voltage 317 and the level shifted common mode voltage 341. In response to the comparison, the power management circuit 232, 248 selectively enables (e.g., powers up) or disables (e.g., powers down) the other receiver circuit(s) 234, 250. For example, if the comparison indicates that the rectified and level shifted voltage 317 is greater than the common mode voltage 341, by a predetermined threshold for example, the power management circuit 232, 248 can enable the other receiver circuit(s) 234, 250 in order to receive information via differential communication path 220, 224. In addition, if the comparison indicates that the rectified and level shifted voltage 317 is not greater than the common mode voltage 341, by a predetermined threshold for example, the power management circuit 232, 248 can disable the other receiver circuit(s) 234, 250 in order to reduce power consumption of the receiver circuit 218, 240.

Figure 4:
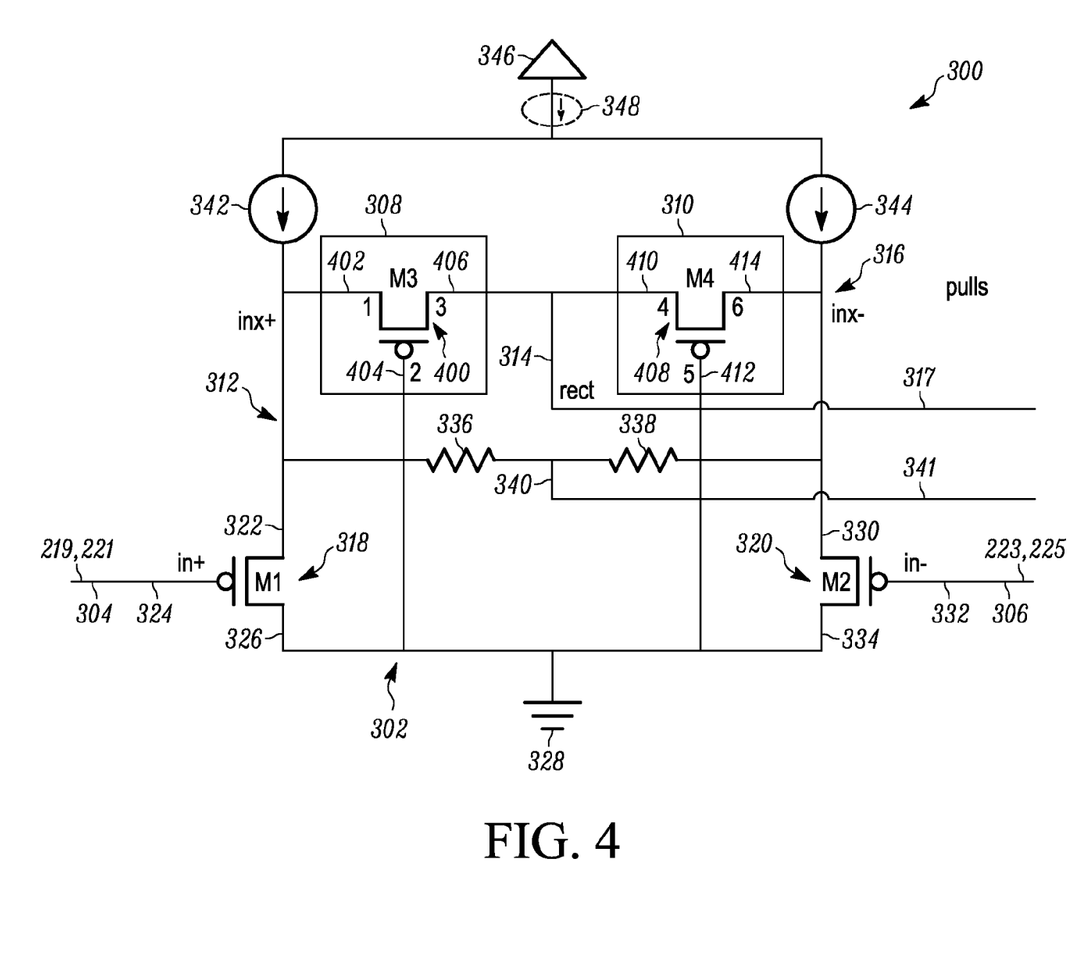
FIG. 4 is an exemplary diagram of one embodiment of the rectifying and level shifting circuit.

Referring now to FIG. 4, an exemplary embodiment of the rectifying and level shifting circuit 300 is depicted. In this example, the first variable impedance circuit 308 comprises a first transistor 400 having a first terminal 402, a second terminal 404, and a third terminal 406. The second variable impedance circuit 310 comprises a second transistor 408 having a fourth terminal 410, a fifth terminal 412, and a sixth terminal 414. The first terminal 402 is coupled to the first branch 312 and the sixth terminal 414 is coupled to the second branch 316. The third terminal 406 is coupled to the fourth terminal 410. The second terminal 404 and the fifth terminal 412 are coupled to the first voltage source 328. As shown, in this example, the first and second transistors 400, 408 are n-channel MOSFETs (i.e., NMOS transistors) however other suitable transistors can be used if desired.

Figure 5:
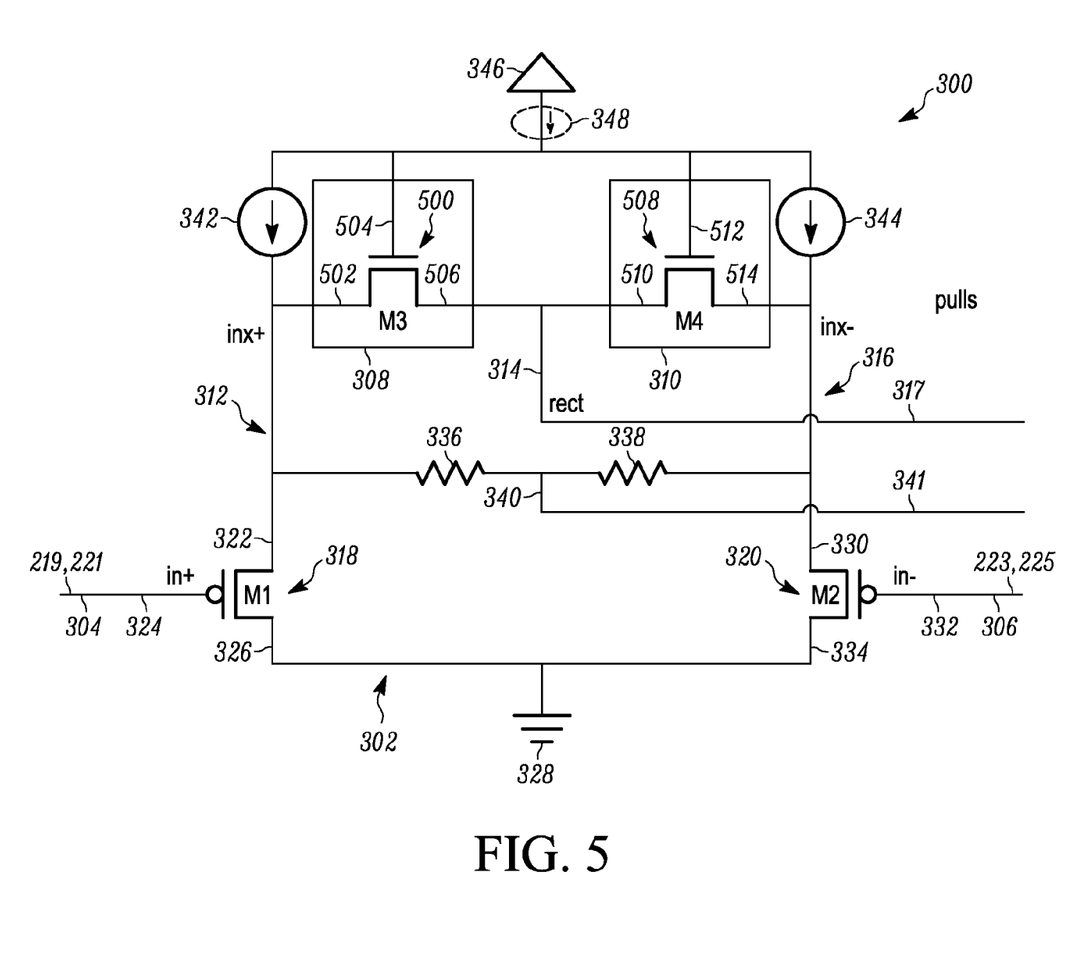
FIG. 5 is an exemplary diagram of another embodiment of the rectifying and level shifting circuit.

Referring now to FIG. 5, another exemplary embodiment of the rectifying and level shifting circuit 300 is depicted. In this example, the first variable impedance circuit 308 comprises a first transistor 500 having a first terminal 502, a second terminal 504, and a third terminal 506. The second variable impedance circuit 310 comprises a second transistor 508 having a fourth terminal 510, a fifth terminal 512, and a sixth terminal 514. The first terminal 502 is coupled to the first branch 312 and the sixth terminal 514 is coupled to the second branch 316. The third terminal 506 is coupled to the fourth terminal 510. The second terminal 504 and the fifth terminal 512 are coupled to the second voltage source 346. As shown, in this example, the first and second transistors 500, 508 are p-channel MOSFETs (i.e., PMOS transistors) however other suitable transistors can be used if desired.

Figure 6:
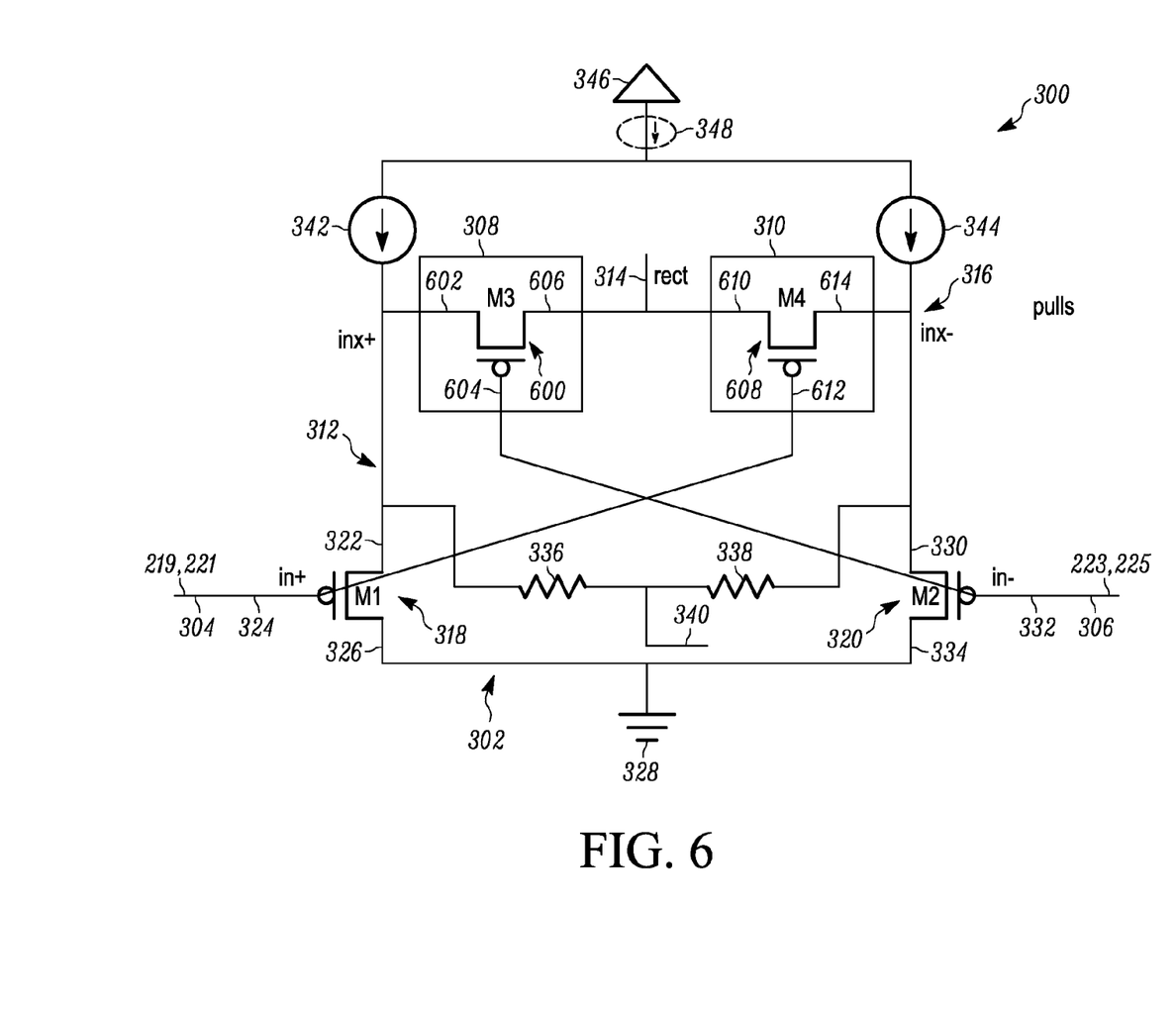
FIG. 6 is an exemplary diagram of yet another embodiment of the rectifying and level shifting circuit.

Referring now to FIG. 6, yet another exemplary embodiment of the rectifying and level shifting circuit 300 is depicted. In this example, the first variable impedance circuit 308 comprises a first transistor 600 having a first terminal 602, a second terminal 604, and a third terminal 606. The second variable impedance circuit 310 comprises a second transistor 608 having a fourth terminal 610, a fifth terminal 612, and a sixth terminal 614. The first terminal 602 is coupled to the first branch 312 and the sixth terminal 614 is coupled to the second branch 316. The third terminal 606 is coupled to the fourth terminal 610. The second terminal 604 is coupled to the second input 306. The fifth terminal 612 is coupled to the first input 304. As shown, in this example, the first and second transistors 600, 608 are n-channel MOSFETs (i.e., NMOS transistors) however other suitable transistors can be used if desired.

As noted above, among other advantages, the rectifying and level shifting circuit 300 provides efficient rectifying and level shifting due to the variable impedances varying in a manner to pull peaks of the differential voltage up to a higher or lower voltage level than conventional circuits. As such, voltage swings are larger than conventional circuits making them easier to detect. In addition, the larger voltage swings can effectively reduce detection errors caused by physical variations in the circuit (e.g., due to manufacturing processes). Other advantages will be recognized by those of ordinary skill in the art.

While this disclosure includes particular examples, it is to be understood that the disclosure is not so limited. Numerous modifications, changes, variations, substitutions, and equivalents will occur to those skilled in the art without departing from the spirit and scope of the present disclosure upon a study of the drawings, the specification, and the following claims.

What is claimed is:

1. A circuit comprising:
a differential circuit having a pair of differential transistors connected to a common end and receiving a differential signal from at least to two inputs;
a first variable impedance circuit, coupled to the common end and between a first branch of the differential circuit and an output, that is operative to provide a first variable impedance; and
a second variable impedance circuit, coupled to the common end and between a second branch of the differential circuit and the output, that is operative to provide a second variable impedance, wherein the first variable impedance and the second variable impedance vary in accordance with a voltage difference of the differential signal between the two inputs.

2. The circuit of claim 1 wherein:
the first variable impedance is at a first impedance value in response to current flowing between the first branch and the second branch of the differential circuit in a first direction and a second impedance value in response to current flowing between the first branch and the second branch of the differential circuit in a second direction opposite the first direction; and
the second variable impedance is at a third impedance value in response to current flowing between the first branch and the second branch of the differential circuit in a third direction and a fourth impedance value in response to current flowing between the first branch and the second branch of the differential circuit in a fourth direction opposite the third direction.

3. The circuit of claim 1 wherein the first variable impedance decreases in response to a first voltage of one of the two inputs being greater than a second voltage of another of the two inputs.

4. The circuit of claim 3 wherein the second variable impedance remains substantially unchanged in response to the first voltage being greater than the second voltage.

5. The circuit of claim 1 wherein:
the first variable impedance circuit comprises a first transistor having a first, second, and third terminal, wherein the first terminal is operatively coupled to the first branch, the second terminal is operatively coupled to said common end and one of the at least two inputs, and the third terminal is operatively coupled to the output; and
the second variable impedance circuit comprises a second transistor having a fourth, fifth, and sixth terminal, wherein the fourth terminal is operatively coupled to the second branch, the fifth terminal is operatively coupled to said common end and another of the at least two inputs, and the sixth terminal is operatively coupled to the output.

6. The circuit of claim 1 further comprising:
a first impedance circuit between the first branch and a second output; and
a second impedance circuit between the second branch and the second output, wherein the output is operative to provide a rectified output voltage and the second output is operative to provide a common mode voltage.

7. The circuit of claim 6 further comprising a comparator circuit operatively coupled to the output and the second output, wherein the comparator circuit is operative to compare the rectified output voltage and the common mode voltage.

8. The circuit of claim 7 further comprising a power management circuit operatively coupled to the comparator circuit, wherein the power management circuit is operative to enable another circuit in response to the comparison of the rectified output voltage and the common mode voltage.

9. An idle detection circuit comprising the circuit of claim 1, wherein a first of the at least two inputs is operative to respond to a first path of a differential communication path and a second of the at least two inputs is operative to respond to a second path of the differential communication path.

10. A receiver circuit comprising the circuit of claim 1, wherein a first of the at least two inputs is operative to respond to a first path of a differential communication path and a second of the at least two inputs is operative to respond to a second path of the differential communication path.

11. A device comprising:
a transmitter circuit operatively coupled to a differential communication path; and
a receiver circuit, operatively coupled to the differential communication path, the receiver circuit comprising:
a differential circuit having a pair of differential transistors connected to a common end and receiving a differential signal from at least to two inputs, wherein each of the at least two inputs are operative to respond to a respective path the differential communication path;
a first variable impedance circuit, coupled to the common end and between a first branch of the differential circuit and an output, that is operative to provide a first variable impedance; and
a second variable impedance circuit, coupled to the common end and between a second branch of the differential circuit and the output, that is operative to provide a second variable impedance, wherein the first variable impedance and the second variable impedance vary in accordance with a voltage difference of the differential signal between the two inputs.

12. The device of claim 11 wherein:
the first variable impedance is at a first impedance value in response to current flowing between the first branch and the second branch of the differential circuit in a first direction and a second impedance value in response to current flowing between the first branch and the second branch of the differential circuit in a second direction opposite the first direction; and
the second variable impedance is at a third impedance value in response to current flowing between the first branch and the second branch of the differential circuit in a third direction and a fourth impedance value in response to current flowing between the first branch and the second branch of the differential circuit in a fourth direction opposite the third direction.

13. The device of claim 11 wherein the first variable impedance decreases in response to a first voltage of one of the two inputs being greater than a second voltage of another of the two inputs and the second variable impedance remains substantially unchanged in response to the first voltage being greater than the second voltage.

14. The device of claim 11 further comprising:
a first impedance circuit between the first branch and a second output; and
a second impedance circuit between the second branch and the second output, wherein the output is operative to provide a rectified voltage and the second output is operative to provide a common mode voltage.

15. The device of claim 14 further comprising:
a comparator circuit operatively coupled to the output and the second output, wherein the comparator circuit is operative to compare the rectified output voltage and the common mode voltage; and
a power management circuit operatively coupled to the comparator circuit, wherein the power management circuit is operative to enable another circuit in response to the comparison between the rectified output voltage and the common mode voltage.

16. A computer readable medium comprising information that when executed by at least one processor causes the at least one processor to:
at least one of: operate, design, and organize a circuit that comprises:
a differential circuit having a pair of differential transistors connected to a common end and receiving a differential signal from at least to two inputs;
a first variable impedance circuit, coupled to the common end and between a first branch of the differential circuit and an output, that is operative to provide a first variable impedance; and
a second variable impedance circuit, coupled to the common end and between a second branch of the differential circuit and the output, that is operative to provide a second variable impedance, wherein the first variable impedance and the second variable impedance vary in accordance with a voltage difference of the differential signal between the two inputs.

17. The computer readable medium of claim 16 wherein the first variable impedance decreases in response to a first voltage of one of the two inputs being greater than a second voltage of another of the two inputs and the second variable impedance remains substantially unchanged in response to the first voltage being greater than the second voltage.

18. The computer readable medium of claim 16 wherein:
the first variable impedance circuit comprises a first transistor having a first, second, and third terminal, wherein the first terminal is operatively coupled to the first branch, the second terminal is operatively coupled to said common end and one of the at least two inputs, and the third terminal is operatively coupled to the output; and the second variable impedance circuit comprises a second transistor having a fourth, fifth, and sixth terminal, wherein the fourth terminal is operatively coupled to the second branch, the fifth terminal is operatively coupled to said common end and another of the at least two inputs, and the sixth terminal is operatively coupled to the output.

19. The computer readable medium of claim 16 wherein the circuit further comprises:

a first impedance circuit between the first branch and a second output; and a second impedance circuit between the second branch and the second output, wherein the output is operative to provide a rectified output voltage and the second output is operative to provide a common mode voltage.

20. The computer readable medium of claim 19 wherein the circuit further comprises a comparator circuit operatively coupled to the output and the second output, wherein the comparator circuit is operative to provide an enable signal in response to rectified output voltage and the common mode voltage.

* * * * *